United States Patent
Jung

(10) Patent No.: US 11,342,013 B2
(45) Date of Patent: May 24, 2022

(54) MEMORY SYSTEM AND OPERATING METHOD TO SET TARGET COMMAND DELAY TIME TO MERGE AND PROCESS READ COMMANDS

(71) Applicant: SK hynix Inc., Gyeonggi-do (KR)

(72) Inventor: Sang Hune Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/209,956

(22) Filed: Mar. 23, 2021

(65) Prior Publication Data

US 2022/0130438 A1   Apr. 28, 2022

(30) Foreign Application Priority Data

Oct. 27, 2020 (KR) .................. 10-2020-0140109

(51) Int. Cl.
   *G11C 7/22* (2006.01)
   *G11C 7/10* (2006.01)

(52) U.S. Cl.
   CPC ............ *G11C 7/222* (2013.01); *G11C 7/1057* (2013.01); *G11C 7/1063* (2013.01); *G11C 7/1084* (2013.01)

(58) Field of Classification Search
   CPC ..... G11C 7/222; G11C 7/1057; G11C 7/1063; G11C 7/1084
   See application file for complete search history.

(56) References Cited

U.S. PATENT DOCUMENTS

| 2012/0127809 A1* | 5/2012 | Ko | .......................... G11C 7/22 365/193 |
| 2014/0189204 A1* | 7/2014 | Sugimoto | ............. G06F 3/0655 711/103 |

FOREIGN PATENT DOCUMENTS

| KR | 10-2019-0032716 | 3/2019 | |
| KR | 10-2019-0088734 | 7/2019 | |
| WO | WO-2012049760 A1 * | 4/2012 | .............. G06F 11/26 |

* cited by examiner

*Primary Examiner* — Sultana Begum
(74) *Attorney, Agent, or Firm* — IP & T Group LLP

(57) ABSTRACT

Embodiments of the present disclosure relate to a memory system and an operating method thereof. According to the embodiments of the present disclosure, the memory system may execute a read operation by setting a command delay time for determining whether to merge and process read commands, for each of a plurality of time periods, and may set a target command delay time, from among the command delay times set for each of the plurality of time periods, to be used for determining whether to merge and process a subsequent read command with one or more prior read commands based on the execution result of the read operation for each of the plurality of time periods.

10 Claims, 15 Drawing Sheets

| Time Period | T_DELAY | No. of input read commands | No. of inputs of read request to memory device | No. of read commands processed in excess of reference latency | Throughput |
|---|---|---|---|---|---|
| 1 | 20us | 11000 | 9000 | 100 | 200K |
| 2 | 15us | 10000 | 9000 | 85 | 210K |
| 3 | 10us | 12000 | 11500 | 80 | 200K |
| 4 | 5us | 9000 | 8900 | 70 | 170K |

Set target command delay time

FIG.7

MAX_T_DELAY = 20us

| time period | T_DELAY |
|---|---|
| 1 | 20us |
| 2 | 15us |
| 3 | 10us |
| 4 | 5us |

| time period | T_DELAY |
|---|---|
| 1 | 20us |
| 2 | 19us |
| 3 | 18us |
| ... | ... |
| 19 | 2us |
| 20 | 1us |

FIG.8

| Time Period | T_DELAY | No. of input read commands | No. of inputs of read request to memory device | No. of read commands processed in excess of reference latency | Throughput |
|---|---|---|---|---|---|
| 1 | 20us | 11000 | 9000 | 100 | 200K |
| 2 | 15us | 10000 | 9000 | 85 | 210K |
| 3 | 10us | 12000 | 11500 | 80 | 200K |
| 4 | 5us | 9000 | 8900 | 70 | 170K |

Set target command delay time

FIG.9
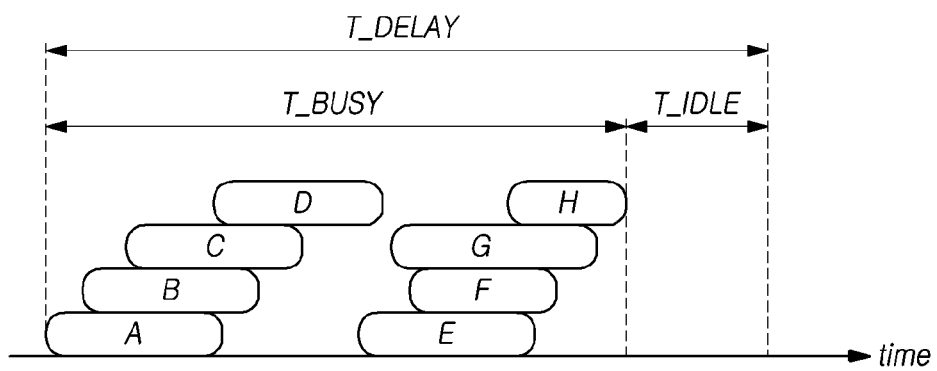
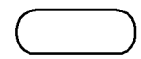

| Time Period | T_DELAY | No. of input read commands | No. of inputs of read request to memory device | No. of read commands processed in excess of reference latency | Throughput |
|---|---|---|---|---|---|
| 1 | 20us | 11000 | 9000 | 100 | 200K |
| 2 | 15us | 10000 | 9000 | 85 | 210K |
| 3 | 10us | 12000 | 11500 | 80 | 200K |
| 4 | 5us | 9000 | 8900 | 70 | 170K |

Select N time periods (periods 1–3)

| Time Period | T_DELAY | No. of input read commands | No. of inputs of read request to memory device | No. of read commands processed in excess of reference latency | Throughput |
|---|---|---|---|---|---|
| 1 | 20us | 11000 | 9000 | 100 | 200K |
| 2 | 15us | 10000 | 9000 | 85 | 210K |
| 3 | 10us | 12000 | 11500 | 80 | 200K |
| 4 | 5us | 9000 | 8900 | 70 | 170K |

Select M time periods (periods 2, 3)

Candidate command delay times (15us, 10us)

| Time Period | T_DELAY | No. of input read commands | No. of inputs of read request to memory device | Ratio | No. of read commands processed in excess of reference latency | Throughput |
|---|---|---|---|---|---|---|
| 1 | 20us | 11000 | 9000 | 81% | 100 | 200K |
| 2 | 15us | 10000 | 9000 | 90% | 85 | 210K |
| 3 | 10us | 12000 | 11500 | 95% | 80 | 200K |
| 4 | 5us | 9000 | 8900 | 98% | 70 | 170K |

Set target command delay time to 15us

Select N time periods with highest throughput — S1410

Set candidate command delay times for target command delay times set — S1420

Set candidate command delay time having lowest ratio of the number of inputs of read request to the memory device compared to the total number of read commands received during corresponding time period as target command delay time (Opt.) — S1430

MEMORY SYSTEM AND OPERATING METHOD TO SET TARGET COMMAND DELAY TIME TO MERGE AND PROCESS READ COMMANDS

CROSS-REFERENCE TO RELATED APPLICATION

The present application claims priority under 35 U.S.C. 119(a) to Korean patent application number 10-2020-0140109, filed on Oct. 27, 2020, which is incorporated herein by reference in its entirety.

BACKGROUND

1. Technical Field

Embodiments relate to a memory system and an operating method thereof.

2. Related Art

A memory system includes a data storage device (or memory device) that stores data on the basis of a request from a host, such as a computer, servers, a smartphone, a tablet PC, or other electronic devices. Examples of the memory system include a traditional magnetic-disk-based hard disk drive (HDD) and a semiconductor-based data storage device such as a solid state drive (SSD), a universal flash storage device (UFS), or an embedded MMC (eMMC) device.

The memory system may further include a memory controller for controlling the memory device. The memory controller may receive a command from the host and, on the basis of the received command, may execute the command or control read, write, and/or erase operations on the memory devices in the memory system. The memory controller may be used to execute firmware operations for performing a logical operation for controlling such operations.

When processing the plurality of read commands received from the host, the memory system may merge and input the read request for read commands satisfying a specific condition to the memory device instead of separately inputting the read request for each of the plurality of read commands into the memory device.

SUMMARY

Embodiments of the disclosure may provide a memory system and an operating method thereof capable of improving the performance of a read operation by minimizing the delay in processing a read command input from a host.

In addition, embodiments of the disclosure may provide a memory system and an operating method thereof capable of reducing the load required in the process of reading data from the memory device.

In one aspect, embodiments of the disclosure may provide a memory system including a memory device, and a memory controller for communicating with the memory device and controlling the memory device.

The memory controller may execute a read operation by setting a command delay time for determining whether to merge and process of read commands, for each of a plurality of time periods.

The memory controller may set a target command delay time, from among the command delay times set for each of the plurality of time periods, to be used for determining whether to merge and process a subsequent read command with one or more prior read commands based on the execution result of the read operation for each of the plurality of time periods.

The memory controller may set the command delay time for each of the plurality of time periods differently within a set maximum command delay time.

The execution result of the read operation for each of the plurality of time periods may include 1) the number of read commands input during the corresponding time period, 2) the number of read requests input to the memory device during the corresponding time period, 3) the number of read commands processed in excess of a reference latency during the corresponding time periods, and 4) a throughput. In this case, the throughput may be determined based on the total size of read data requested by the read command input during each of the time periods and the time taken to process the read command.

The memory controller may set one or more candidate command delay time for setting the target command delay time based on the throughput and the number of read commands processed in excess of the reference latency for each of the plurality of time periods.

In this case, the memory controller may select N time periods having the highest throughput from among the plurality of time periods (N is a natural number greater than or equal to 2), and may set M command delay times set in M time periods in which the number of read commands processed in excess of the reference latency is the smallest among the N time periods as the candidate command delay times (M is a natural number less than or equal to N).

The memory controller may set, among the M candidate command delay times, the candidate command delay time having the lowest ratio of the number of read requests input to the memory device to the total number of read commands received during corresponding time period as the target command delay time.

In another aspect, embodiments of the disclosure may provide an operating method of a memory system including a memory device.

The operating method of the memory system may include the step of executing a read operation by setting a command delay time for determining whether to merge and process read commands, for each of a plurality of time periods.

In this case, the command delay times for each of the plurality of time periods are set differently within a set maximum command delay time.

In addition, the operating method of the memory system may include the step of setting a target command delay time, from among the command delay times set for each of the plurality of time periods, to be used for determining whether to merge and process a subsequent read command with one or more previous commands based on the execution result of the read operation for each of the plurality of time periods.

In this case, the execution result of the read operation for each of the plurality of time periods may include 1) the number of read commands input during the corresponding time period, 2) the number of read requests input to the memory device during the corresponding time period, 3) the number of read commands processed in excess of a reference latency during the corresponding time period, and 4) a throughput. The throughput may be determined based on the total size of read data requested by the read command input during each of the time periods and the time taken to process the read command.

In the step of setting the target command delay time, one or more candidate command delay times for setting the target command delay time may be set based on the throughput and the number of read commands processed in excess of the reference latency for each of the plurality of time periods.

The step of setting the target command delay time may include the step of selecting N time periods having the highest throughput from among the plurality of time periods (N is a natural number greater than or equal to 2), and the step of setting M command delay times set in M time periods in which the number of read commands processed in excess of the reference latency is the smallest among the N time periods as candidate command delay times (M is a natural number less than or equal to N).

The step of setting the target command delay time may include the step of setting, among the M candidate command delay times, the candidate command delay time having the lowest ratio of the number of read requests input to the memory device to the total number of read commands received during corresponding time period as the target command delay time.

According to embodiments of the disclosure, it is possible to improve the performance of the read operation by minimizing the delay in processing the read command input from the host.

In addition, according to embodiments of the disclosure, it is possible to reduce the load required in the process of reading data from the memory device.

BRIEF DESCRIPTION OF THE DRAWINGS

FIG. 7 is a diagram illustrating an example of the command delay time for each of the plurality of time periods according to embodiments of the present disclosure.

FIG. 8 is a diagram illustrating an example of determining the target command delay time from command delay times for each of the plurality of time periods of FIG. 7.

FIG. 9 is a diagram illustrating an example of a method of calculating the throughput of FIG. 8.

FIG. 10 is a diagram illustrating an example of selecting N time periods in FIG. 8.

FIG. 11 is a diagram illustrating an example of selecting M candidate command delay times based on the N time periods selected in FIG. 10.

FIG. 14 is a diagram illustrating an example of setting the target command delay time of FIG. 13.

DETAILED DESCRIPTION

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Figure 1:
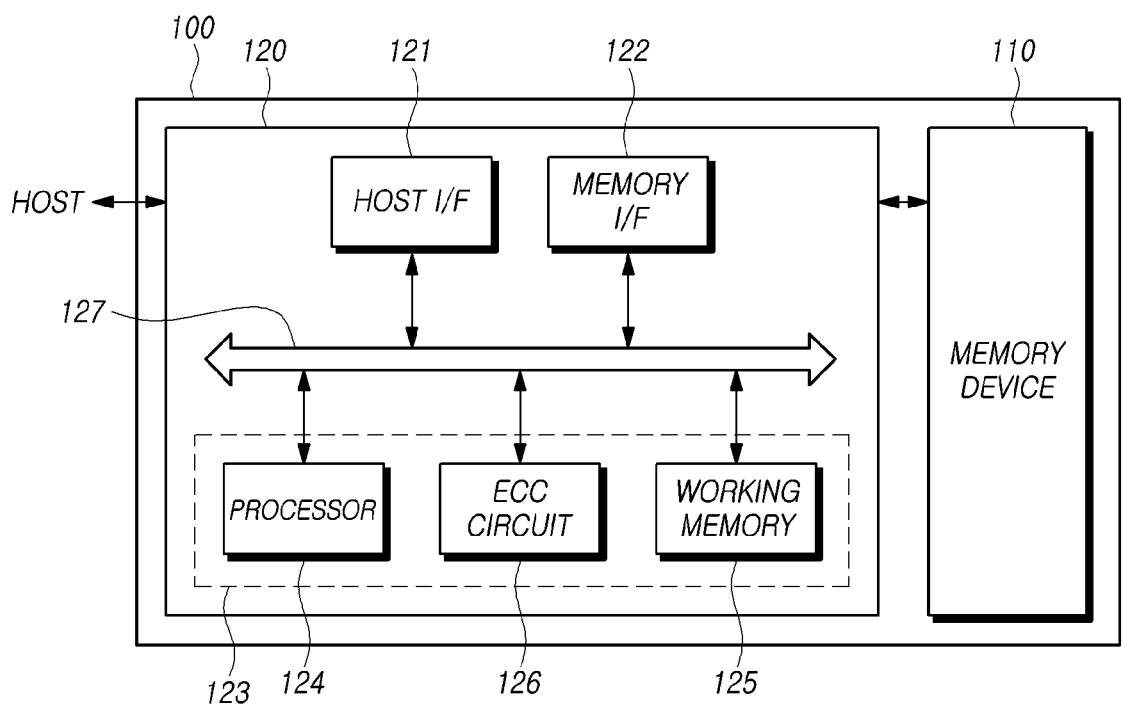
FIG. 1 is a schematic diagram illustrating a configuration of a memory system based on an embodiment of the disclosed technology.

FIG. 1 is a schematic diagram illustrating a configuration of a memory system 100 based on an embodiment of the disclosed technology.

In some implementations of FIG. 1, the memory system 100 may include a memory device 110 configured to store data, and a memory controller 120 configured to control the memory device 110.

The memory device 110 may include multiple memory blocks each including a plurality of memory cells for storing data. The memory device 110 may be configured to operate in response to control signals received from the memory controller 120. Operations of the memory device 110 may include, for example, a read operation, a program operation (also referred to as a "write operation"), an erase operation, and the like.

The memory cells in the memory device 110 are used to store data and may be arranged in a memory cell array. The memory cell array may be divided into memory blocks of memory cells and each block includes different pages of memory cells. In typical implementations of NAND flash memory devices, a page of memory cells is the smallest memory unit that can be programmed or written, and the data stored in memory cells can be erased at the block level.

In some implementations, the memory device 110 may be implemented as any of various types, such as a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM).

The memory device 110 may be implemented in a three-dimensional array structure. Some embodiments of the disclosed technology are applicable to any type of flash memory devices having an electric charge storage layer. In an implementation, the electric charge storage layer may be formed of a conductive material, and such an electric charge storage layer can be called a floating gate. In another implementation, the electric charge storage layer may be formed of an insulating material, and such a flash memory device can be called a charge trap flash (CTF).

The memory device 110 may be configured to receive a command and an address from the memory controller 120 to access an area of the memory cell array selected using the address. That is, the memory device 110 may perform an operation corresponding to the received command on a memory area of the memory device having a physical address corresponding to the received address from the memory controller 120.

In some implementations, the memory device 110 may perform a program operation, a read operation, an erase operation, and the like. During the program operation, the memory device 110 may write data in the area selected by the address. During the read operation, the memory device 110 may read data from a memory area selected by the address. During the erase operation, the memory device 110 may erase data stored in a memory area selected by the address.

The memory controller 120 may control write (program), read, erase, and background operations that are performed on the memory device 110. The background operation may include, for example, operations that are implemented to optimize overall performance of the memory device 110, such as a garbage collection operation (GC), a wear leveling (WL) operation, and a bad block management (BBM) operation.

The memory controller 120 may control the operation of the memory device 110 at the request of a host. Alternatively, the memory controller 120 may control the operation of the memory device 110 even in absence of request from the host when it performs such background operations of the memory device 110.

The memory controller 120 and the host may be separate devices. In some implementations, the memory controller 120 and the host may be integrated and implemented as a single device. In the following description, the memory controller 120 and the host are considered as separate devices as an example.

Referring to FIG. 1, the memory controller 120 may include a host interface (I/F) 121, a memory interface (I/F) 122, and a control circuit 123.

The host interface 121 may be configured to provide an interface for communication with the host.

When receiving a command from the host (HOST), the control circuit 123 may receive the command through the host interface 121 and may perform an operation of processing the received command.

The memory interface 122 may be directly or indirectly connected to the memory device 110 to provide an interface for communication with the memory device 110. That is, the memory interface 122 may be configured to provide the memory device 110 and the memory controller 120 with an interface for the memory controller 120 to perform memory operations on the memory device 110 based on control signals and instructions from the control circuit 123.

The control circuit 123 may be configured to control the operation of the memory device 110 through the memory controller 120. For example, the control circuit 123 may include a processor 124 and a working memory 125. The control circuit 123 may further include an error detection/correction circuit (ECC circuit) 126.

The processor 124 may control overall operation of the memory controller 120. The processor 124 may perform a logical operation. The processor 124 may communicate with the host through the host interface 121. The processor 124 may communicate with the memory device 110 through the memory interface 122.

The processor 124 may be used to perform operations associated with a flash translation layer (FTL) to effectively manage the memory operations on the memory system 100.

The processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, based on the mapping unit. Typical address mapping methods may include a page mapping method, a block mapping method, and a hybrid mapping method.

The processor 124 may be configured to randomize data received from the host to write the randomized data to the memory cell array of the memory device 110. For example, the processor 124 may randomize data received from the host by using a randomizing seed. The randomized data is provided to the memory device 110 and written to the memory cell array.

The processor 124 may be configured to derandomize data received from the memory device 110 during a read operation. For example, the processor 124 may derandomize data received from the memory device 110 by using a derandomizing seed. The derandomized data may be output to the host.

The processor 124 may execute firmware (FW) to control the operation of the memory controller 120. In other words, the processor 124 may control overall operation of the memory controller 120 and, in order to perform a logical operation, may execute (drive) firmware loaded into the working memory 125 during booting.

The firmware refers to a program or software stored on a certain nonvolatile memory and is executed inside the memory system 100.

In some implementations, the firmware may include various functional layers. For example, the firmware may include at least one of a flash translation layer (FTL), a host interface layer (HIL) and a flash interface layer (FIL). The flash translation layer (FTL) is configured to translate a logical address in the host requests to a physical address of the memory device 110. The host interface layer (HIL) is configured to interpret a command that the host issues to a data storage device such as the memory system 100 and to deliver the command to the FTL. The flash interface layer (FIL) is configured to deliver a command issued by the FTL to the memory device 110.

For example, the firmware may be stored in the memory device 110, and then loaded into the working memory 125.

The working memory 125 may store firmware, program codes, commands, or pieces of data used to operate the memory controller 120. The working memory 125 may include, for example, at least one among a static RAM (SRAM), a dynamic RAM (DRAM), and a synchronous RAM (SDRAM) as a volatile memory.

The error detection/correction circuit 126 may be configured to detect and correct one or more erroneous bits in the data by using an error detection and correction code. In some implementations, the data that is subject to the error detection and correction may include data stored in the working memory 125, and data retrieved from the memory device 110.

The error detection/correction circuit 126 may be implemented to decode data by using the error correction code. The error detection/correction circuit 126 may be implemented by using various decoding schemes. For example, a decoder that performs decoding using nonsystematic code or a decoder that performs decoding using systematic code may be used.

In some implementations, the error detection/correction circuit 126 may detect one or more erroneous bits on a sector basis. That is, each piece of read data may include multiple sectors. In this disclosure, a sector may refer to a data unit that is smaller than the read unit (e.g., page) of a flash memory. Sectors constituting each piece of read data may be mapped based on addresses.

In some implementations, the error detection/correction circuit 126 may calculate a bit error rate (BER) and determine whether the number of erroneous bits in the data is within the error correction capability sector by sector. For example, if the BER is greater than a reference value, the error detection/correction circuit 126 may determine that the erroneous bits in the corresponding sector are uncorrectable and the corresponding sector is marked "fail." If the BER is less than or equal to the reference value, the error detection/correction circuit 126 may determine that the corresponding sector is correctable or the corresponding sector can be marked "pass."

The error detection/correction circuit 126 may perform error detection and correction operations successively on all read data. When a sector in the read data is correctable, the error detection/correction circuit 126 may move on to the next sector to check as to whether an error correction operation is needed on the next sector. Upon completion of the error detection and correction operations on all the read data in this manner, the error detection/correction circuit 126 may acquire information as to which sector is deemed uncorrectable in the read data. The error detection/correction circuit 126 may provide such information (e.g., address of uncorrectable bits) to the processor 124.

The memory system 100 may also include a bus 127 to provide a channel between the constituent elements 121, 122, 124, 125, and 126 of the memory controller 120. The bus 127 may include, for example, a control bus for delivering various types of control signals and commands, and a data bus for delivering various types of data.

By way of example, FIG. 1 illustrates the above-mentioned constituent elements 121, 122, 124, 125, and 126 of the memory controller 120. It is noted that some of those illustrated in the drawings may be omitted, or some of the above-mentioned constituent elements 121, 122, 124, 125, and 126 of the memory controller 120 may be integrated into a single element. In addition, in some implementations, one or more other constituent elements may be added to the above-mentioned constituent elements of the memory controller 120.

Figure 2:
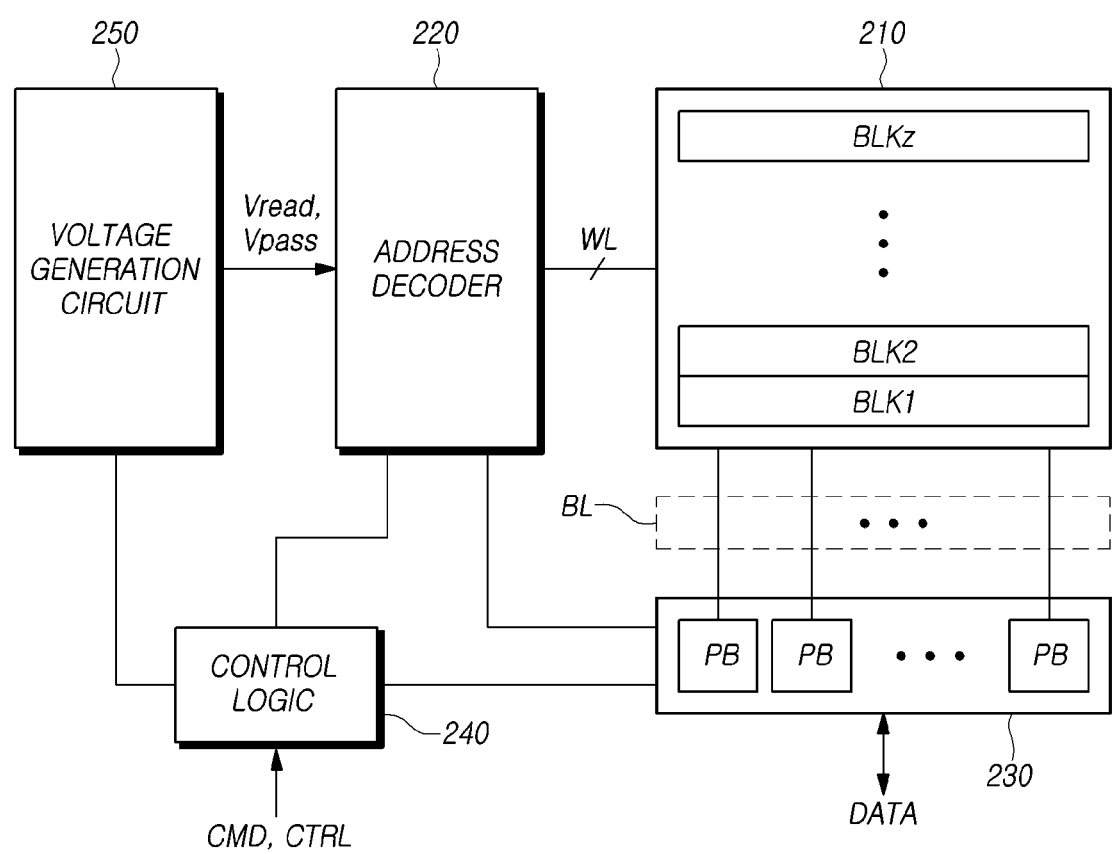
FIG. 2 is a block diagram schematically illustrating a memory device based on an embodiment of the disclosed technology.

FIG. 2 is a block diagram schematically illustrating a memory device 110 based on an embodiment of the disclosed technology.

In some implementations of FIG. 2, the memory device 110 based on an embodiment of the disclosed technology may include a memory cell array 210, an address decoder 220, a read/write circuit 230, a control logic 240, and a voltage generation circuit 250.

The memory cell array 210 may include multiple memory blocks BLK1-BLKz, where z is a natural number greater than or equal to 2.

In the multiple memory blocks BLK1-BLKz, multiple word lines WL and multiple bit lines BL may be disposed in rows and columns, and multiple memory cells MC may be arranged.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells. In some implementations, such nonvolatile memory cells may be arranged in a vertical channel structure.

In some implementations, the memory cell array 210 may be configured as a memory cell array having a two-dimensional structure. In other implementations, the memory cell array 210 may be arranged in a three-dimensional structure.

Each of the multiple memory cells in the memory cell array 210 may store at least one bit of data. For example, each of the multiple memory cells in the memory cell array 210 may be a single-level cell (SLC) configured to store one bit of data, a multi-level cell (MLC) configured to store two bits of data, a triple-level cell (TLC) configured to store three bits of data, or a quad-level cell (QLC) configured to store four bits of data. In another example, the memory cell array 210 may include multiple memory cells, each of which may be configured to store at least five bits of data per memory cell.

Referring to FIG. 2, the address decoder 220, the read/write circuit 230, the control logic 240, and the voltage generation circuit 250 may collectively operate as a peripheral circuit configured to drive the memory cell array 210.

The address decoder 220 may be connected to the memory cell array 210 through the multiple word lines WL.

The address decoder 220 may be configured to operate in response to command and control signals of the control logic 240.

The address decoder 220 may receive addresses through an input/output buffer (not shown) inside the memory device 110. The address decoder 220 may be configured to decode a block address among the received addresses. The address decoder 220 may select at least one memory block based on the decoded block address.

The address decoder 220 may receive a read voltage Vread and a pass voltage Vpass from the voltage generation circuit 250.

During a read operation, the address decoder 220 may apply the read voltage Vread to a selected word line WL inside a selected memory block and apply the pass voltage Vpass to the remaining non-selected word lines WL.

During a program verification operation, the address decoder 220 may apply a verification voltage generated by the voltage generation circuit 250 to a selected word line WL inside a selected memory block and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include at least one of a block address, a row address, and a column address.

The address decoder 220 may select one memory block and one word line based on the block address and the row address. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation. The read/write circuit 230 may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that participates in a data processing function and, in some implementations, may further include a cache buffer for data caching.

The multiple page buffers PB may be connected to the memory cell array 210 through the multiple bit lines BL. In order to detect or sense the threshold voltage Vth of the memory cells during a read operation and a program verification operation, the multiple page buffers PB may continuously supply a sensing current to the bit lines BL connected to the memory cells to detect, at a sensing node, a change proportional to the amount of current that varies depending on the program state of a corresponding memory cell, and may hold or latch the corresponding voltage as sensing data.

The read/write circuit 230 may operate in response to page buffer control signals output from the control logic 240.

During a read operation, the read/write circuit 230 senses a voltage value of a memory cell and the voltage value is read out as data. The read/write circuit 230 temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control overall operation of the memory device 110 in response to the control signal CTRL. The control logic 240 may output a control signal for adjusting the voltage level of sensing nodes of multiple page buffers PB to a pre-charge voltage level.

The control logic 240 may control the read/write circuit 230 to perform a read operation on the memory cell array 210. The voltage generation circuit 250 may generate a read voltage Vread and a pass voltage Vpass, which are used during the read operation, in response to a voltage generation circuit control signal output from the control logic 240.

A memory block BLK in the memory device 110 may include multiple pages PG. In some implementations, a plurality of memory cells arranged in columns form memory cell strings, and a plurality of memory cells arranged in rows form memory blocks. Each of the multiple pages PG is coupled to one of word lines WL, and each of the memory cell strings STR is coupled to one of bit lines BL.

In the memory block BLK, multiple word lines WL and multiple bit lines BL may be arranged in rows and columns. For example, each of the multiple word lines WL may be arranged in the row direction, and each of the multiple bit lines BL may be arranged in the column direction. In another example, each of the multiple word lines WL may be arranged in the column direction, and each of the multiple bit lines BL may be arranged in the row direction.

In some implementations, the multiple word lines WL and the multiple bit lines BL may intersect with each other, thereby addressing a single memory cell in the array of multiple memory cells MC. In some implementations, each memory cell MC may include a transistor TR that includes a material layer that can hold an electrical charge.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some implementations, at least one dummy word line may be additionally arranged between the first outermost word line and the first selection line. In addition, at least one dummy word line may be additionally arranged between the second outermost word line and the second selection line.

A read operation and a program operation (write operation) of the memory block may be performed page by page, and an erase operation may be performed memory block by memory block.

Figure 3:
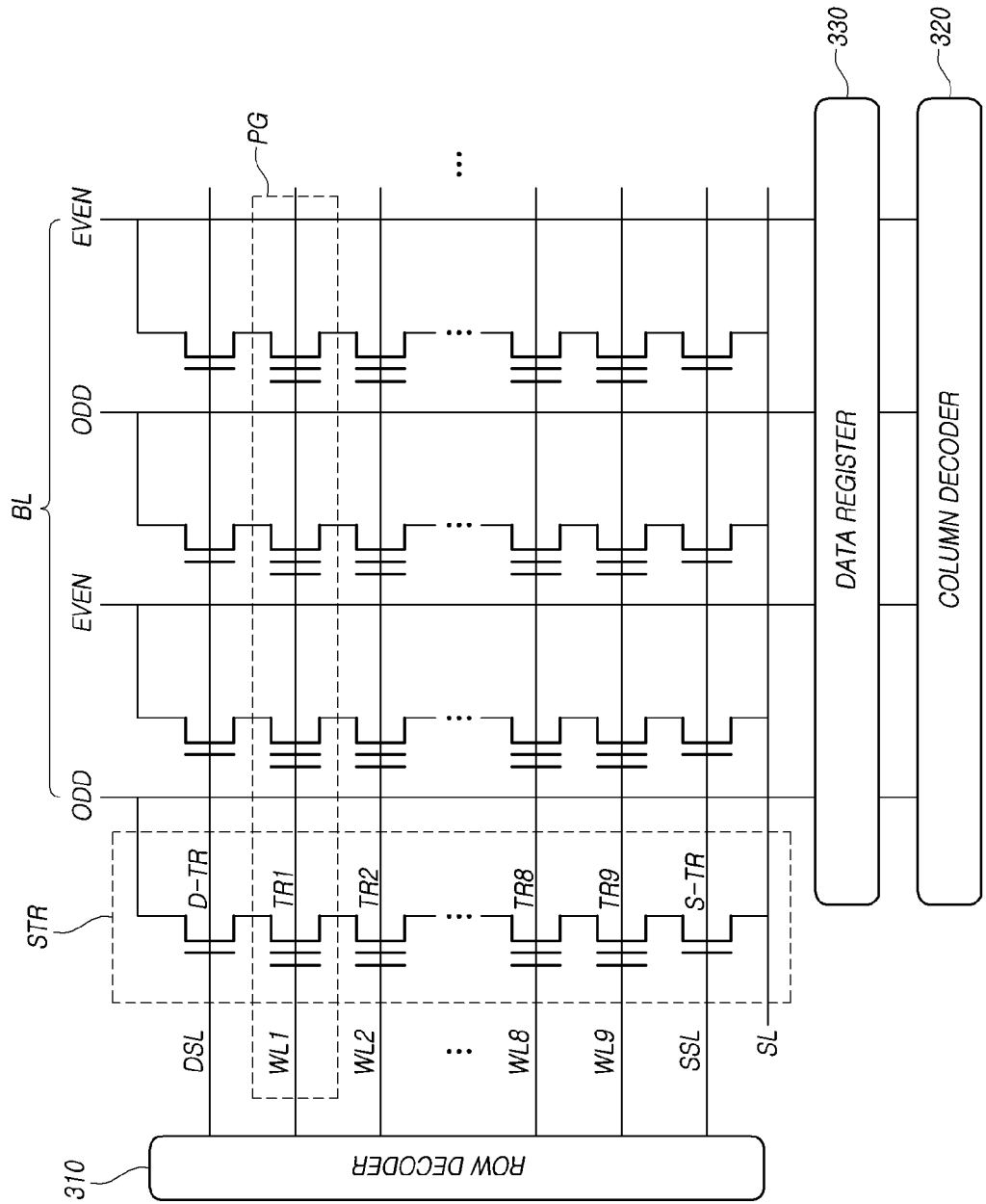
FIG. 3 is a diagram illustrating a structure of word lines and bit lines of a memory device based on an embodiment of the disclosed technology.

FIG. 3 is a diagram illustrating a structure of word lines WL and bit lines BL of a memory device 110 based on an embodiment of the disclosed technology.

Referring to FIG. 3, the memory device 110 has a core area in which memory cells MC are arranged, and an auxiliary area (the remaining area other than the core area) to include circuitry that is used to perform the operations of the memory cell array 210.

In the core area, a certain number of memory cells arranged in one direction can be called "page" PG, and a certain number of memory cells that are coupled in series can be called "memory cell string" STR.

The word lines WL1-WL9 may be connected to a row decoder 310. The bit lines BL may be connected to a column decoder 320. A data register 330, which corresponds to the read/write circuit 230 of FIG. 2, may exist between the multiple bit lines BL and the column decoder 320.

The multiple word lines WL1-WL9 may correspond to multiple pages PG.

For example, each of the multiple word lines WL1-WL9 may correspond to one page PG as illustrated in FIG. 3. When each of the multiple word lines WL1-WL9 has a large size, each of the multiple word lines WL1-WL9 may correspond to at least two (e.g., two or four) pages PG. Each page PG is the smallest unit in a program operation and a read operation, and all memory cells MC within the same page PG may perform simultaneous operations when conducting a program operation and a read operation.

The multiple bit lines BL may be connected to the column decoder 320. In some implementations, the multiple bit lines BL may be divided into odd-numbered bit lines BL and even-numbered bit lines BL such that a pair of odd-numbered bit line and even-numbered bit line are coupled in common to the column decoder 320.

In accessing a memory cell MC, the row decoder 310 and the column decoder 320 are used to locate a desired memory cell based on the address.

In some implementations, the data register 330 plays an important role because all data processing by the memory device 110, including program and read operations, occurs via the data register 330. If data processing by the data register 330 is delayed, all of the other areas need to wait until the data register 330 finishes the data processing, degrading overall performance of the memory device 110.

Referring to the example illustrated in FIG. 3, in one memory cell string STR, multiple transistors TR1-TR9 may be connected to multiple word lines WL1-WL9, respectively. In some implementations, the multiple transistors TR1-TR9 correspond to memory cells MC. In this example, the multiple transistors TR1-TR9 include control gates CG and floating gates FG.

The multiple word lines WL1-WL9 include two outermost word lines WL1 and WL9. A first selection line DSL may be additionally arranged outside the first outermost word line WL1, which is closer to the data register 330 and has a shorter signal path compared to the other outermost word line WL9. A second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR is used as a switch circuit that connects the corresponding memory cell string STR to the data register 330. The second selection transistor S-TR is used as a switch that connects the corresponding memory cell string STR to the source line SL. That is, the first selection transistor D-TR and the second selection transistor S-TR can be used to enable or disable the corresponding memory cell string STR.

In some implementations, the memory system 100 applies a turn-on voltage Vcc to the gate electrode of the first selection transistor D-TR, thereby turning on the first selection transistor D-TR. Further, the memory system 100 applies a turn-off voltage (e.g., 0V) to the gate electrode of the second selection transistor S-TR, thereby turning off the second selection transistor S-TR.

The memory system 100 turns on both of the first and second selection transistors D-TR and S-TR during a read operation or a verification operation. Accordingly, during a read operation or a verification operation, an electric current may flow through the corresponding memory cell string STR and drain to the source line SL, which corresponds to the ground, such that the voltage level of the bit line BL can be measured. However, during a read operation, there may be a time difference in the on/off timing between the first selection transistor D-TR and the second selection transistor S-TR.

The memory system 100 may apply a voltage (e.g., +20V) to the substrate through a source line SL during an erase operation. The memory system 100 applies a certain voltage to allow both the first selection transistor D-TR and the second selection transistor S-TR to float during an erase operation. As a result, the applied erase voltage can remove electrical charges from the floating gates FG of the selected memory cells.

Figure 4:
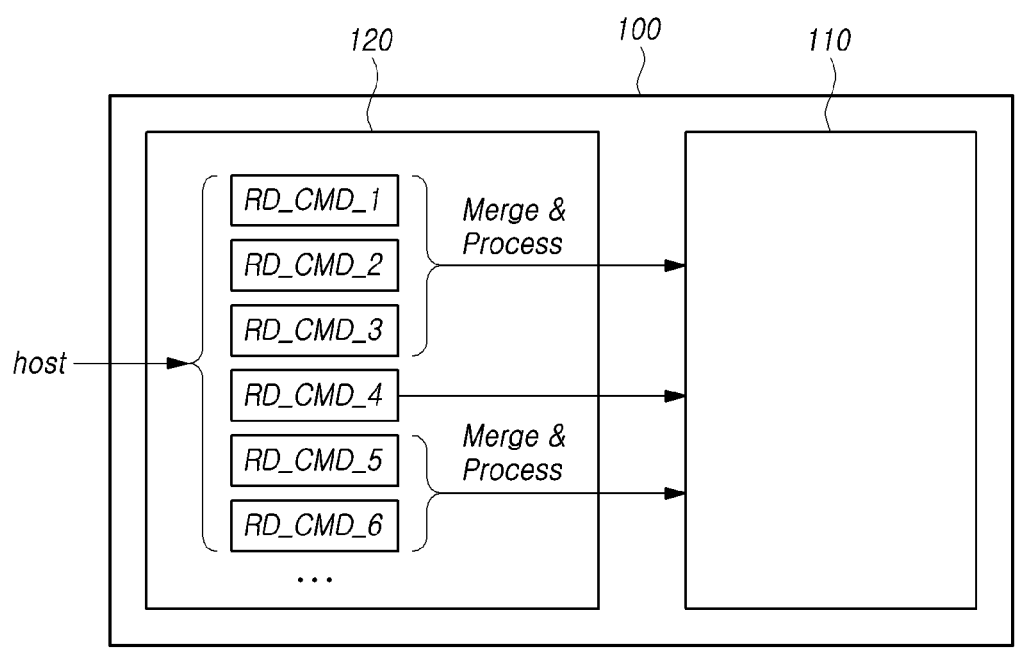
FIG. 4 is a schematic diagram illustrating an operation of the memory system according to embodiments of the present disclosure.

FIG. 4 is a schematic diagram illustrating an operation of the memory system 100 according to embodiments of the present disclosure.

Referring to FIG. 4, the memory controller 120 of the memory system 100 may merge and process at least two of the plurality of read commands when processing the plurality of read commands including RD_CMD_1, RD_CMD_2, RD_CMD_3, RD_CMD_4, RD_CMD_5, RD_CMD_6, . . . , which are input from the host.

Merging and processing of a plurality of read commands may mean reading data requested by the plurality of read commands at the same time instead of separately reading data requested by each of the plurality of read commands. For example, when merging and processing three read commands requesting the data read of 4 KB respectively, the memory controller 120 may input the data read request of 4 KB*3=12 KB to the memory device 110 only once instead of inputting the 4 KB data read request to the memory device 110 three times. In the case of merging and processing the plurality of read commands as described above, the number of data read requests input to the memory device 110 for reading the same data size can be reduced. Therefore, the amount of resources consumed by the memory device 110 in the process of reading data may be reduced, and as a result, the overhead expended in the process of reading data from the memory device by the memory system 100 can be reduced.

The memory controller 120 may select read commands which can be merged and processed from among the plurality of read commands including RD_CMD_1, RD_CMD_2, RD_CMD_3, RD_CMD_4, RD_CMD_5, RD_CMD_6, . . . , which are input from the host, and may read data requested by corresponding read commands at the same time.

In the illustrated example of FIG. 4, the memory controller 120 may merge and process the read commands RD_CMD_1, RD_CMD_2, and RD_CMD_3. In addition, the memory controller 120 may merge and process the read commands RD_CMD_5 and RD_CMD_6.

In this case, the memory controller 120 may set a specific reference or criterion and may determine which read commands are to be merge-processed among the plurality of read commands input from the host according to the set reference.

In embodiments of the present disclosure, the memory controller 120 may determine whether to merge and process the read command based on the command delay time. This aspect is described with reference to FIG. 5.

Figure 5:
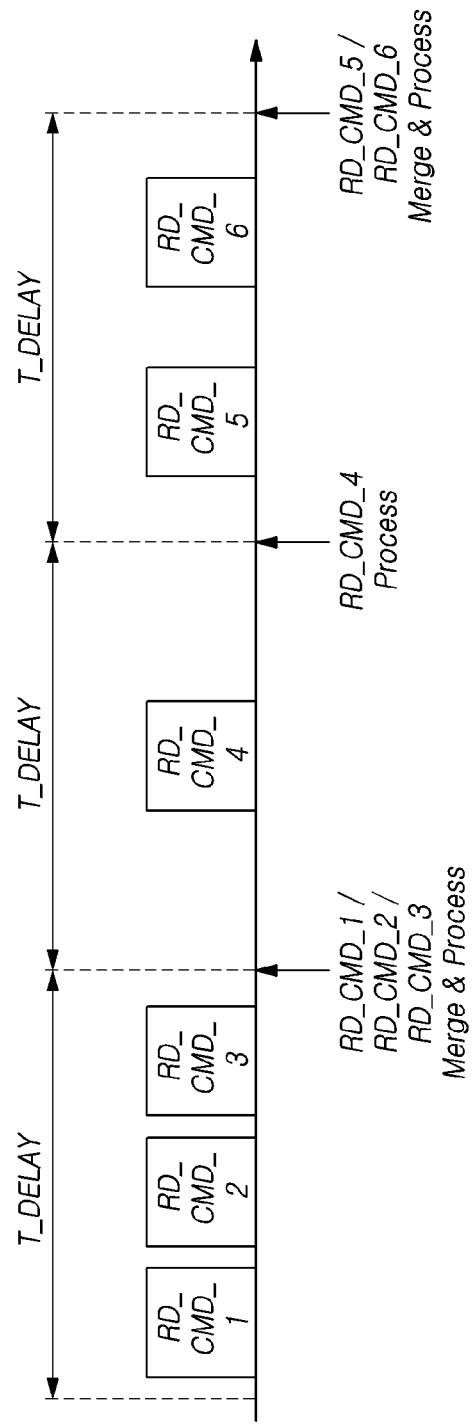
FIG. 5 is a diagram illustrating the operation of merging and processing of the read command by the memory system according to embodiments of the present disclosure.

FIG. 5 is a diagram illustrating the operation of merging and processing of the read command by the memory system 100 according to embodiments of the present disclosure.

Referring to FIG. 5, the memory controller 120 of the memory system 100 may merge and process one or more read commands when one or more read commands are input from the host during the command delay time T_DELAY.

In FIG. 5, the memory controller 120 may merge and process three read commands RD_CMD_1, RD_CMD_2, and RD_CMD_3 input during the same command delay time T_DELAY.

In addition, for the read command RD_CMD_4, there is no other read command input during the same command delay time T_DELAY. Accordingly, the memory controller 120 may process the read command RD_CMD_4 alone without merging and processing the read command RD_CMD_4 with other read commands.

In FIG. 5, the memory controller 120 may merge and process the two read commands RD_CMD_5 and RD_CMD_6 input during the same command delay time T_DELAY.

FIG. 5 illustrates a case in which the memory controller 120 merges and processes all read commands input during the same command delay time T_DELAY. However, the memory controller 120 may merge and process only read commands satisfying a specific condition among read commands input during the same command delay time T_DELAY. For example, the memory controller 120 may merge and process only read commands for reading data stored in different planes of the same die in the memory device 110 among read commands input during the same command delay time T_DELAY.

As described above, when the memory controller 120 of the memory system 100 merges and processes the plurality of read commands input during the command delay time, the performance of processing the read command may vary depending on the setting method of the command delay time.

The longer the command delay time, the higher the possibility that the memory controller 120 merges and processes the read commands input from the host. However, the read commands input from the host may remain in a standby state in the memory controller 120 until the read commands are merge and processed. Accordingly, the timing of processing the read command input to the host and responding to the host may be delayed, and as a result, quality of service (QoS) for the host may be deteriorated.

In contrast, the shorter the command delay time is, the faster the memory controller 120 can process each read command received from the host, thus improving QoS for the host. However, since the number of read commands to be merged and processed is reduced, the overhead expended by the memory system 100 to process the read commands may increase.

Therefore, the memory controller 120 of the memory system 100 may, by considering both the QoS for the host and the overhead expended to process the read commands, set the target command delay time to an optimal command delay time capable of both reducing the overhead expended in the process of reading data from the memory device and minimizing the delay of processing the command input from the host. Further, the memory controller 120 may set the target command delay time as the reference for determining whether to merge and process the subsequent read command.

Hereinafter, an operation of determining the target command delay time by the memory system 100 is described according to embodiments of the present disclosure.

Figure 6:
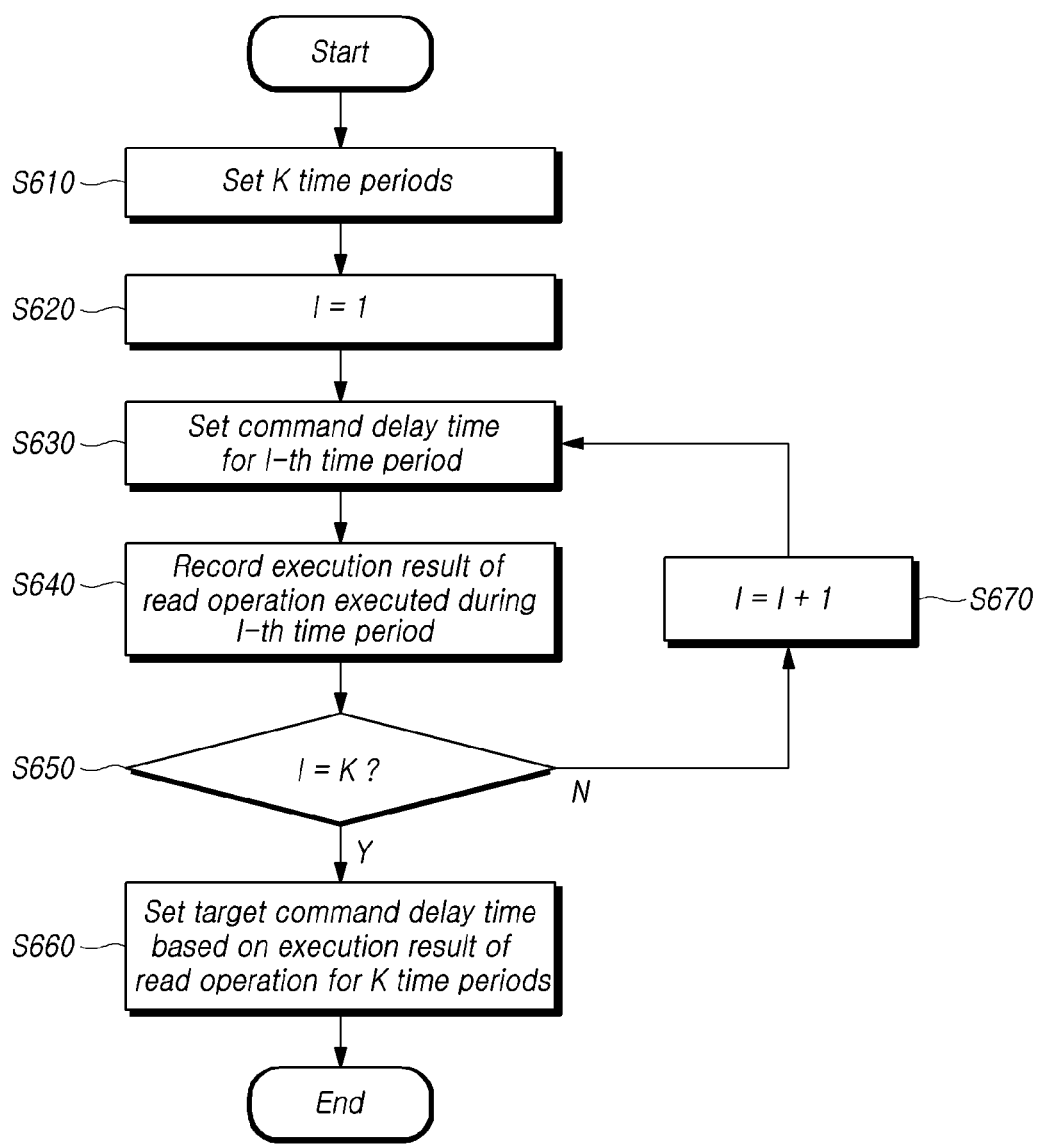
FIG. 6 is a flowchart illustrating an example of the operation of determining the target command delay time by the memory system according to embodiments of the present disclosure.

FIG. 6 is a flowchart illustrating an example of the operation of determining the target command delay time by the memory system 100 according to embodiments of the present disclosure.

Referring to FIG. 6, the memory controller 120 of the memory system 100 may set K time periods (K is a natural number of 2 or more) (S610). In some embodiments, the value of K and the length of each time period may be set to various values. For example, the memory controller 120 may set 20 time periods with a daily unit.

In addition, the memory controller 120 may initialize the index I to 1, indicating the first time period (S620). Index I is used to perform a read operation for each of the K time periods.

In addition, the memory controller 120 may set the command delay time for the I-th time period (S630). Then, the memory controller 120 may execute the read operation (i.e., process the plurality of read commands received from the host) during the I-th time period based on the command delay time set for the I-th time period.

In addition, the memory controller 120 may record the execution result of the read operation executed during the I-th time period (S640). In some embodiments, the execution result of the read operation may be recorded using a data structure such as a table or a list.

The memory controller 120 may determine whether I is equal to K (S650). When it is determined that I is equal to K (S650-Y), this means that the execution result of the read operation has been recorded for all K time periods. Accordingly, the memory controller 120 may set the target command delay time based on the execution result of the read operation for each K time period recorded (S660).

When it is determined that the value of I is not equal to K (S650-N), this means that at least one time period in which the execution result of the read operation has not been recorded remains among the K time periods. Accordingly, the memory controller 120 may increase I by 1 (S670), and then return to operation S630 again to execute the read operation for the next time period.

Hereinafter, a specific example of the contents described in FIG. 6 is described. First, a method of setting the command delay time for each of K time periods in operation S630 is described.

FIG. 7 is a diagram illustrating an example of the command delay time for each of the plurality of time periods according to embodiments of the present disclosure.

When setting the command delay time for each of the plurality of time periods, the memory controller 120 of the memory system 100 may set the command delay time for each of the plurality of time periods differently within the specific maximum command delay time.

In FIG. 7, it is assumed that the maximum command delay time MAX_T_DELAY is 20 us. In some embodiments, when setting the command delay time for the four time periods, the memory controller 120 may differently set the command delay time for each of the four time periods to 20 us, 15 us, 10 us, 5 us respectively within the maximum command delay time of 20 us.

In other embodiments, when the memory controller 120 sets the command delay time for 20 time periods, the memory controller 120 may set the command delay times for 20 time periods to 20 us, 19 us, 18 us, . . . , 2 us, 1 us which are different from each other.

Hereinafter, a specific operation of determining the target command delay time based on the execution result of the read operation recorded for each of the plurality of time periods in operation S660 of FIG. 6 is described. Hereinafter, it is assumed that four time periods are set and the command delay time set for each time period is 20 us, 15 us, 10 us, and 5 us, respectively.

FIG. 8 is a diagram illustrating an example of determining the target command delay time from command delay times for each of the plurality of time periods of FIG. 7.

By way of example, FIG. 8 illustrates the command delay time set for each of four time periods and the execution result of the read operation executed for each time period.

In FIG. 8, the execution result of the read operation for each of the plurality of time periods may include 1) the number of read commands input during the corresponding time period, 2) the number of inputs of a read request to the memory device 110 during the corresponding time period, 3) the number of read commands processed in excess of a reference latency during the corresponding time period, and 4) throughput for the corresponding time period.

The read commands processed in excess of the reference latency may mean the number of read commands for which the processing time (i.e., the time from input of a command from the host to the response associated with the command to the host) exceeds the set reference latency (e.g., 200 us) among all read commands. This may be an index indicating QoS for the host, and it may mean that the fewer the number of read commands processed in excess of the reference latency, the better the QoS for the host.

The throughput may be an index indicating the performance of the memory system 100 to process the read command received from the host. The higher the throughput, the more efficiently the memory system 100 processes the read command (i.e., minimizing the overhead expended to process read commands). In some embodiments, the unit of throughput may be (data size)/(time).

In embodiments of the present disclosure, the throughput for each of time periods may be determined based on the total size of read data requested by the read command input during that time period and the time taken to process the read command. An example of determining the throughput is described in detail with reference to FIG. 9 below.

In time period 1 of FIG. 8, the command delay time in time period 1 is 20 us, 11000 read commands are input from the host, and the number of times a read request is input to the memory device is 9000. Among the read commands input from the host, the number of read commands processed in excess of the reference latency is 100 and the throughput is 200K.

In time period 2, the command delay time is 15 us, 10000 read commands are input from the host, and the number of read requests input to the memory device is 9000. Among the read commands input from the host, the number of read commands processed in excess of the reference latency is 85 and the throughput is 210K.

In time period 3, the command delay time is 10 us, 12000 read commands are input from the host, and the number of read requests input to the memory device is 11500. Among the read commands input from the host, the number of read commands processed in excess of the reference latency is 80 and the throughput is 200K.

In time period 4, the command delay time is 5 us, 9000 read commands are input from the host, and the number of read requests input to the memory device is 8900. Among the read commands input from the host, the number of read commands processed in excess of the reference latency is 70 and the throughput is 170K.

In some embodiments, the memory controller 120 may set the candidate command delay time for setting the target command delay time based on the throughput and the number of read commands processed in excess of the reference latency measured for each time period. This aspect is described in detail with reference to FIGS. 10 to 11.

FIG. 9 is a diagram illustrating an example of a method of calculating the throughput of FIG. 8.

Referring to FIG. 9, the throughput may be determined by dividing the sum of the size of the read data requested by the read command received from the host during the delay time T_DELAY by the busy time T_BUSY which is the time when the memory controller 120 of the memory system 100 is in a busy state. The busy state of the memory controller 120 may mean a state in which the memory controller 120 processes one or more read commands. Accordingly, the time when the memory controller 120 is in the busy state may refer to the time it takes for the memory controller 120 to process the read commands.

The busy time T_BUSY may be a value obtained by subtracting the idle time T_IDLE which is a time when the memory system 100 is idle, from the command delay time T_DELAY.

In FIG. 9, the memory system 100 processes eight read commands, and assumes that the size of read data requested by the eight read commands is A, B, C, D, E, F, G, H, respectively. In this case, the throughput may be determined as (A+B+C+D+E+F+G+H)/(T_BUSY).

For example, it is assumed that the read data requested by eight read commands is 4 KB, 8 KB, 4 KB, 4 KB, 4 KB, 8 KB, 16 KB, 4 KB, respectively, the total command delay time is 20 us, the busy time is 15 us, and the idle time is 5 us. In this case, the throughput is 52/15 (KB/us).

For another example, it is assumed that the read commands requested by the eight read commands are 4 KB, 4 KB, 4 KB, 4 KB, 4 KB, 4 KB, 4 KB, 4 KB, respectively, the total command delay time is 30 us, the busy time is 20 us, and the idle time is 10 us. In this case, the throughput is 32/20 (KB/us).

Hereinafter, an example of the operation of determining the target command delay time by the memory controller 120 of the memory system 100 is described with reference to FIGS. 10 to 12.

First, the memory controller 120 may select N (N is a natural number) time periods having the highest throughput among the four time periods. As described above, the high throughput means that the memory system 100 efficiently processes read commands input from the host.

Hereinafter, the case of N=3 is described as an example.

FIG. 10 is a diagram illustrating an example of selecting N time periods in FIG. 8.

In FIG. 10, if N is 3, the memory controller 120 may select time periods 1, 2, and 3, which are three time periods having the highest throughput among the four time periods. On the other hand, time period 4 with the lowest throughput is not selected.

In addition, the memory controller 120 may select M time periods (M is a natural number less than N) with the smallest number of read commands processed in excess of the reference latency among the selected N time periods, and may set M command delay times set for the M time periods as the candidate command delay times for the target command delay times. As described above, the fact that the number of read commands processed in excess of the reference latency is small may mean that QoS for the host is good.

Hereinafter, the case of M=2 is described as an example.

FIG. 11 is a diagram illustrating an example of selecting M candidate command delay times (e.g., M=2) based on the N time periods (e.g., N=3) selected in FIG. 10.

In FIG. 11, the memory controller 120 may select time periods 2 and 3 which are two time periods in which the number of read commands processed in excess of the reference latency is the least, among the three time periods selected in FIG. 10, as the candidate time periods. In addition, the memory controller 120 may set one of the command delay time of 15 us set for time period 2 and the command delay time of 10 us set for time period 3 as the target command delay time.

In embodiments of the present disclosure, the memory controller 120 may set, among the M candidate command delay times, the candidate command delay time having the lowest ratio of the number read requests input to the memory device to the total number of read commands received during corresponding time period as the target command delay time. This is because the lower the ratio of the number of read requests input to the memory device to the total number of read commands, the higher the ratio of read commands being merged and processed to all read commands.

Figure 12:
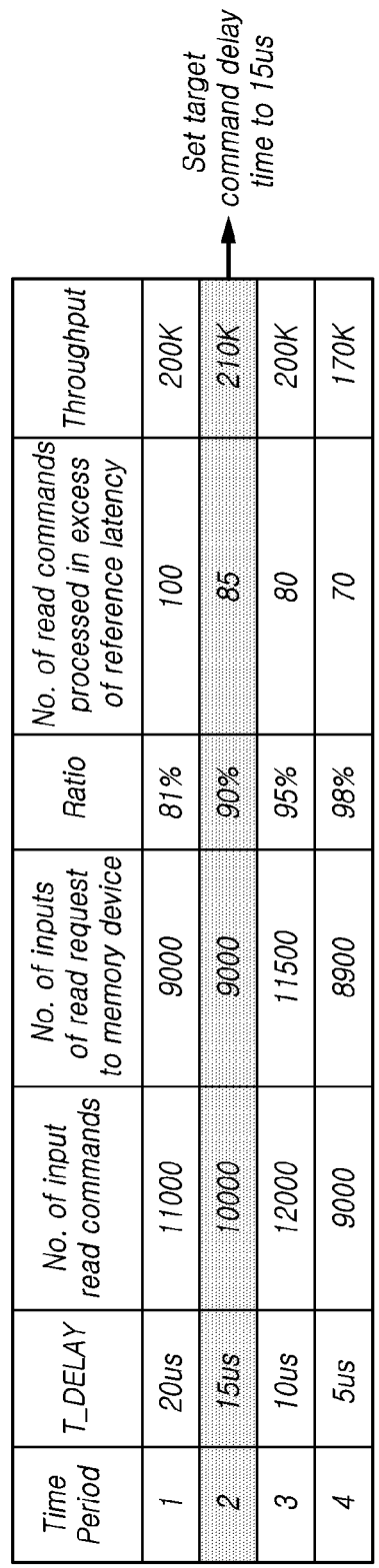
FIG. 12 is a diagram illustrating an example of selecting the target command delay time from among M candidate command delay times selected in FIG. 11.

FIG. 12 is a diagram illustrating an example of selecting the target command delay time from among M candidate command delay times (e.g., M=2) selected in FIG. 11.

Referring to FIG. 12, for time period 2 and time period 3 which are two candidate time periods selected in FIG. 11, the ratio of the number of read requests input to the memory device to the total number of read commands received during time period 2 is about 90% ($^{9000}/_{10000}$). On the other hand, the ratio of the number of read requests input to the memory device to the total number of read commands received during time period 3 is about 95% ($^{11500}/_{12000}$). Accordingly, the memory controller 120 may set the command delay time of 15 us set for the time period 2 as the target command delay time.

Figure 13:
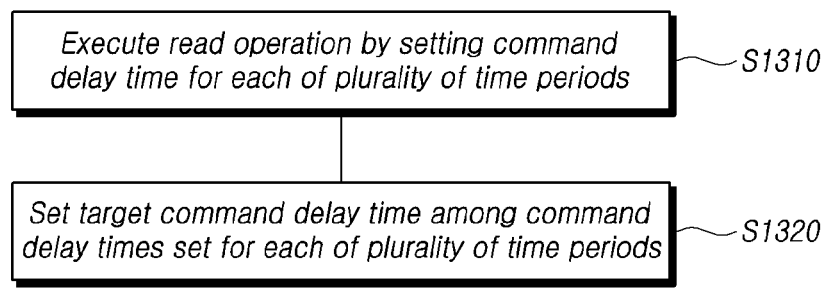
FIG. 13 is a diagram illustrating an operating method of the memory system according to embodiments of the present disclosure.

FIG. 13 is a diagram illustrating an operating method of the memory system 100 according to embodiments of the present disclosure.

Referring to FIG. 13, the operating method of the memory system 100 may include executing the read operation by setting the command delay time which is a reference for determining whether to merge and process the read command, for each of a plurality of set time periods (S1310).

In some embodiments, the command delay times set for each of the plurality of time periods may be set differently within the set maximum command delay time.

In addition, the operating method of the memory system may include setting the target command delay time to be used as a reference for determining whether to merge and process a subsequent read command among the command delay times set in each of the plurality of time periods based on the execution result of the read operation for each of the plurality of time periods (S1320).

In some embodiments, the execution result of the read operation for each of the plurality of time periods may include 1) the number of read commands input during that time period, 2) the number read requests input to the memory device during that time period, 3) the number of read commands processed in excess of a reference latency during that time period, and 4) the throughput. The throughput may be determined based on the total size of read data requested by the read command input during each of the time periods and the time taken to process the read command.

In setting the target command delay time (S1320), the target command delay time may be set based on the throughput and the number of read commands processed in excess of the reference latency for each of the plurality of time periods.

FIG. 14 is a diagram illustrating an example of the operation S1320 of setting the target command delay time of FIG. 13.

Referring to FIG. 14, the operation S1320 of setting the target command delay time may include selecting N time periods having the highest throughput from among the plurality of time periods (N is a natural number greater than or equal to 2) (S1410). Further, the operation S1320 may include setting M command delay times set for M time periods, respectively, in which the number of read commands processed in excess of the reference latency is the smallest among the N time periods as the candidate command delay times for the target command delay time (M is a natural number less than or equal to N) (S1420).

The operation S1320 of setting the target command delay time may further include, optionally, setting, among the M candidate command delay times, the candidate command delay time having the lowest ratio of the number of read request inputs to the memory device to the total number of read commands received during corresponding time period as the target command delay time (S1430).

In some implementations, the operation of the memory controller 120 described above may be controlled by the control circuit 123, and may operate in such a manner that the processor 124 executes (drives) firmware to control overall operation of the memory controller 120.

Figure 15:
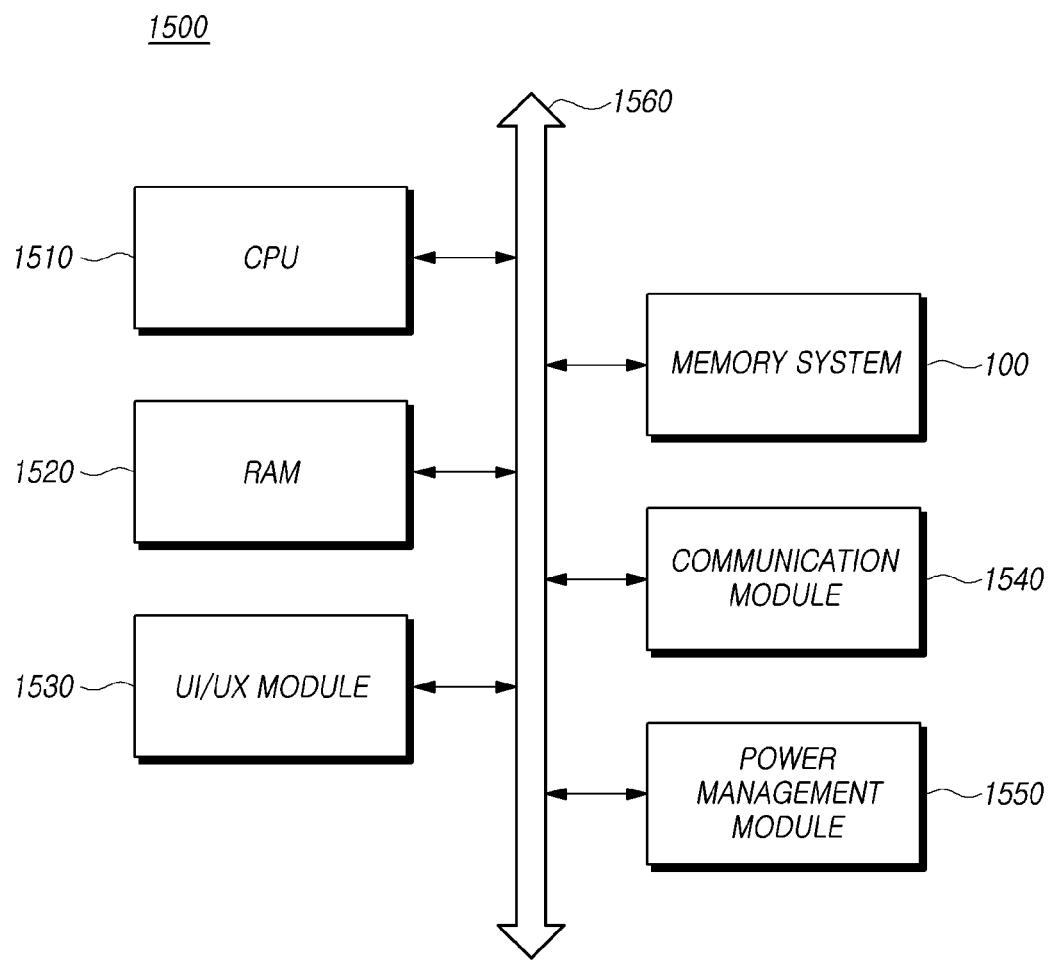
FIG. 15 is a diagram illustrating a configuration of a computing system based on some embodiments of the disclosed technology.

FIG. 15 is a diagram illustrating a configuration of a computing system 1500 based on an embodiment of the disclosed technology.

Referring to FIG. 15, the computing system 1500 may include: a memory system 100 electrically connected to a system bus 1560; a central processing unit (CPU) 1510 configured to control overall operation of the computing system 1500; a random access memory (RAM) 1520 configured to store data and information related to operations of the computing system 1500; a user interface/user experience (UI/UX) module 1530 configured to provide the user with a user environment; a communication module 1540 configured to communicate with an external device as a wired and/or wireless type; and a power management module 1550 configured to manage power used by the computing system 1500.

The computing system 1500 may be a personal computer (PC) or may include a mobile terminal such as a smartphone, a tablet or any of various other electronic devices.

The computing system 1500 may further include a battery for supplying an operating voltage, an application chipset, a graphic-related module, a camera image processor, and a DRAM. Of course, the computing system 1500 may include other elements as those skilled in the art understand.

The memory system 100 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as any of various types of storage devices and mounted on or inside any of various electronic devices.

Based on embodiments of the disclosed technology described above, the operation delay time of the memory system may be advantageously reduced or minimized. In addition, based on an embodiment of the disclosed technology, overhead occurring in the process of calling a specific function may be advantageously reduced or minimized. Although various embodiments of the disclosed technology have been described with particular specifics and varying details for illustrative purposes, those skilled in the art will appreciate that various modifications, additions and substitutions may be made based on what is disclosed herein.

What is claimed is:

1. A memory system comprising:
a memory device; and
a memory controller for communicating with the memory device and controlling the memory device,
wherein the memory controller
executes a read operation by setting a command delay time, which is time used for determining whether to merge and process read commands, for each of a plurality of time periods, and
sets a target command delay time, from among the command delay times set for each of the plurality of time periods, to be used for determining whether to merge and process a subsequent read command with one or more prior read commands based on the execution result of the read operation for each of the plurality of time periods, wherein data requested by read commands inputted during the command delay time is processed simultaneously when the read commands are merged and processed, wherein read commands inputted during each of the plurality of time periods is merged and processed based on the command delay time set for the each of the plurality of time periods, and wherein the execution result of the read operation for each of the plurality of time periods includes the number of read commands input during the corresponding time period, the number of read requests input to the memory device during the corresponding time period, the number of read commands processed in excess of a reference latency during the corresponding time period, and a throughput, and wherein the throughput is determined based on the total size of read data requested by the read command input during each of the time periods and the time taken to process the read command.

2. The memory system of claim 1, wherein the memory controller sets the command delay time for each of the plurality of time periods differently within a set maximum command delay time.

3. The memory system of claim 1, wherein the memory controller sets one or more candidate command delay times for setting the target command delay time based on the throughput and the number of read commands processed in excess of the reference latency for each of the plurality of time periods.

4. The memory system of claim 3, wherein the memory controller
selects N time periods having the highest throughput from among the plurality of time periods, and
sets M command delay times set in M time periods in which the number of read commands processed in excess of the reference latency is the smallest among the N time periods as the candidate command delay times, and
wherein N is a natural number greater than or equal to 2, and M is a natural number less than or equal to N.

5. The memory system of claim 4, wherein the memory controller sets, among the M candidate command delay times, the candidate command delay time having the lowest ratio of the number read requests input to the memory device to the total number of read commands received during corresponding time period as the target command delay time.

6. An operating method of a memory system including a memory device comprising:
executing a read operation by setting a command delay time, which is time for determining whether to merge and process read commands, for each of a plurality of time periods; and
setting a target command delay time, from among the command delay times set for each of the plurality of time periods, to be used for determining whether to merge and process a subsequent read command with one or more previous commands based on the execution result of the read operation for each of the plurality of time periods, wherein data requested by read commands inputted during the command delay time is processed simultaneously when the read commands are merged and processed, wherein read commands inputted during each of the plurality of time periods is merged and processed based on the command delay time set for the each of the plurality of time periods, and wherein the execution result of the read operation for each of the plurality of time periods includes the number of read commands input during the corresponding time period, the number of read requests input to the memory device during the corresponding time period, the number of read commands processed in excess of a reference latency during the corresponding time period, and a throughput, and wherein the throughput is determined based on the total size of read data requested by the read command input during each of the time periods and the time taken to process the read command.

7. The operating method of claim 6, wherein the command delay times for each of the plurality of time periods are set differently within a set maximum command delay time.

8. The operating method of claim 6, wherein setting the target command delay time comprises setting one or more candidate command delay times for setting the target command delay time based on the throughput and the number of read commands processed in excess of the reference latency for each of the plurality of time periods.

9. The operating method of claim 8, wherein setting the target command delay time comprises:
selecting N time periods having the highest throughput from among the plurality of time periods; and
setting M command delay times set in M time periods in which the number of read commands processed in excess of the reference latency is the smallest among the N time periods as the candidate command delay times, and
wherein N is a natural number greater than or equal to 2, and M is a natural number less than or equal to N.

10. The operating method of claim 9, wherein setting the target command delay time comprises setting, among the M candidate command delay times, the candidate command delay time having the lowest ratio of the number of read requests input to the memory device to the total number of read commands received during corresponding time period as the target command delay time.

* * * * *